(12) United States Patent
Kathirgamanathan

(10) Patent No.: US 6,605,317 B1
(45) Date of Patent: Aug. 12, 2003

(54) METHOD FOR FORMING FILMS OR LAYERS

(75) Inventor: Poopathy Kathirgamanathan, North Harrow (GB)

(73) Assignee: South Bank University Enterprise Ltd., London (GB)

( * ) Notice: Subject to any disclaimer, the term of this patent is extended or adjusted under 35 U.S.C. 154(b) by 0 days.

(21) Appl. No.: 09/857,287

(22) PCT Filed: Dec. 1, 1999

(86) PCT No.: PCT/GB99/04030
§ 371 (c)(1),
(2), (4) Date: Jun. 1, 2001

(87) PCT Pub. No.: WO00/32719
PCT Pub. Date: Jun. 8, 2000

(30) Foreign Application Priority Data

Dec. 2, 1998 (GB) .............................................. 9826405

(51) Int. Cl.$^7$ .............................. B05D 5/06; C23C 16/18

(52) U.S. Cl. ..................... 427/162; 427/250; 427/255.6

(58) Field of Search .............................. 427/250, 255.6, 427/162

(56) References Cited

U.S. PATENT DOCUMENTS

| | | | |
|---|---|---|---|
| 4,356,429 A | | 10/1982 | Tang |
| 4,455,364 A | | 6/1984 | Sasa |
| 4,720,432 A | | 1/1988 | VanSlyke et al. |
| 4,885,211 A | | 12/1989 | Tang et al. |
| 5,128,587 A | | 7/1992 | Skotheim et al. |
| 5,281,489 A | | 1/1994 | Mori et al. |
| 5,435,937 A | | 7/1995 | Bell et al. |
| 5,680,292 A | * | 10/1997 | Thompson, Jr. et al. .... 361/528 |
| 5,755,999 A | | 5/1998 | Shi et al. |
| 5,757,026 A | | 5/1998 | Forrest et al. |
| 5,834,058 A | * | 11/1998 | Wallbridge et al. ......... 427/252 |
| 5,976,236 A | * | 11/1999 | Yoshihara et al. ....... 106/286.6 |
| 6,083,634 A | * | 7/2000 | Shi ............................. 428/690 |
| 6,110,529 A | * | 8/2000 | Gardiner et al. ............. 427/250 |

FOREIGN PATENT DOCUMENTS

| | | | |
|---|---|---|---|
| EP | 0087309 | | 2/1983 |
| EP | 0278629 | | 1/1988 |
| EP | 0461542 | | 6/1991 |
| EP | 0461542 A2 | * | 12/1991 |
| EP | 0556005 | | 2/1993 |
| EP | 0569827 | | 5/1993 |
| EP | 0744451 | | 5/1995 |
| EP | 0936844 | | 2/1999 |
| JP | 61037887 | | 2/1986 |
| JP | 1-256584 | | 10/1989 |
| JP | 1-282291 | | 11/1989 |
| JP | 06145146 | | 11/1992 |
| WO | 9802018 | | 1/1998 |
| WO | 9855561 | | 12/1998 |
| WO | 9858037 | | 12/1998 |

OTHER PUBLICATIONS

Junji Kido, et al. "Multilayer White Light–Emitting Organic Electroluminescent Device" Science, Mar. 1995, vol. 267, pp. 1332–1334.

Y. Hamada, et al., Blue Electroluminescence in Thin Films of Azomethin–Zinc Complexes, Japanese Journal of Applied Physics, vol. 32, Apr. 1, 1993, No. 4A, pp. L511–L513.

M. Berggren, et al., Ultraviolet Electroluminescence from an Organic Light Emitting Diode, Advance Materials, 7(1995), Nov. No. 11; pp. 900–903.

N. Armaroli, Luminescence properties of $Eu^{3+}$, $Tb^{3-}$, and $Gd^{3+}$ complexes of the hexadentate N–donor podand tris–[3–(2–pyridyl) pyrazol–lyl] hydroborate, Chemical Physics Letters 276, Sep. 26, 1997, pp. 435–440.

N.C. Greenham, et al., Measurement of absolute photoluminescence quantum efficiencies in conjugated polymers, Chemical Phsics Letters, Jul. 14, 1995, 241, pp. 89–96.

L. Liu, et al., Europium complexes as emitters in organicelectroluminescent devices, Synthetic Metals 91, 1997, pp. 267–269.

S. Dirr, et al., Luminescence enhancement in microcavity organic multilayer structures, Synthetic Metals, 9, 1997, pp. 53–56.

J. Kido, et al., White–Light–Emitting Organic Electroluminescent Device Using Lanhanide Complexes, Japanese Journal of Applied Physics No. 35, 1996, pp. L304–L396.

K. Hensen , et al., Darstellung Von N–BZW. O–Chlormethylsilyl–Derivaten der Amine 1,2,3,4–Tetrahydro–1, 10–Phenanthrolin und 8–Hydroxychinolin, Journal of Organometallic Chemistry, 209, 1981, pp. 17–23.

J. Kido, et al., Organic Electroluminescent Devices Using Lanthanide Complexes; Department of Materials Science and Engineering, 1995, Yamagata University, Yamagata Japan, pp. 110–111.

C. J. Kepert, et al., Structural Systematics of Rare Earth Complexes. V+ The Hydrated 1:1 Adducts of 2,2':6', 2"–Terpyridine with Lanthanoid(III) Chlorides, Australian Journal of Cheistry, 1994, 47, pp. 365–384.

K. Machida, et al., Redox Behavior and Luminescence Property of Europium Polymer Complexes, Department of Applied Chemistry, Faculty of Engineering, Osaka University, Osaka Japan, 1991, pp. 70–71.

K. Hayashi, et al., Syntheses and Structural Studies of Lanthanide Mixed Ligand Complexescontaining B–diketone, Department of Chemistry, Faculty of Science, Ochanomizu University, Tokyo, Japan, 1996, pp. 210–211.

(List continued on next page.)

Primary Examiner—Bret Chen
(74) Attorney, Agent, or Firm—Goodwin Procter LLP

(57) ABSTRACT

An improved method for forming films of organic-metallic complexes in which an organic complex and a labile metal salt are vaporised together or sequentially and the vapour condensed on to a substrate to form a film or layer of the organic-metallic complex on the substrate. The method produces electroluminescent films with improved performance.

13 Claims, 3 Drawing Sheets-

OTHER PUBLICATIONS

Figure 1A:
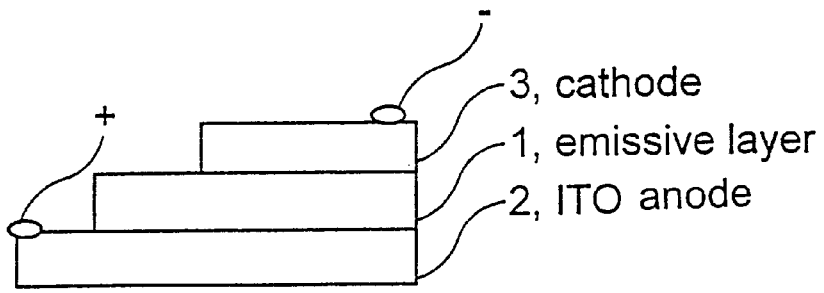
Figure 1B:
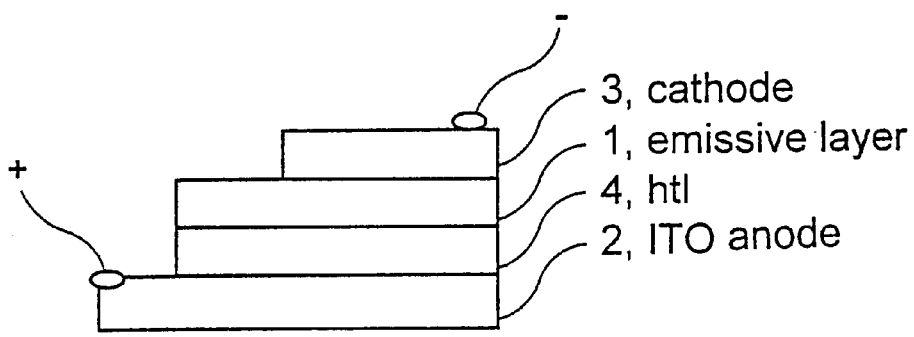
Figure 1C:
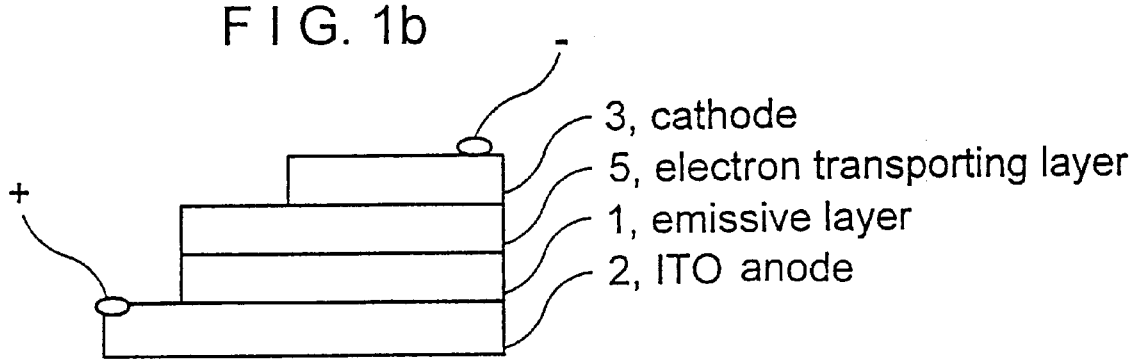
Figure 1D:
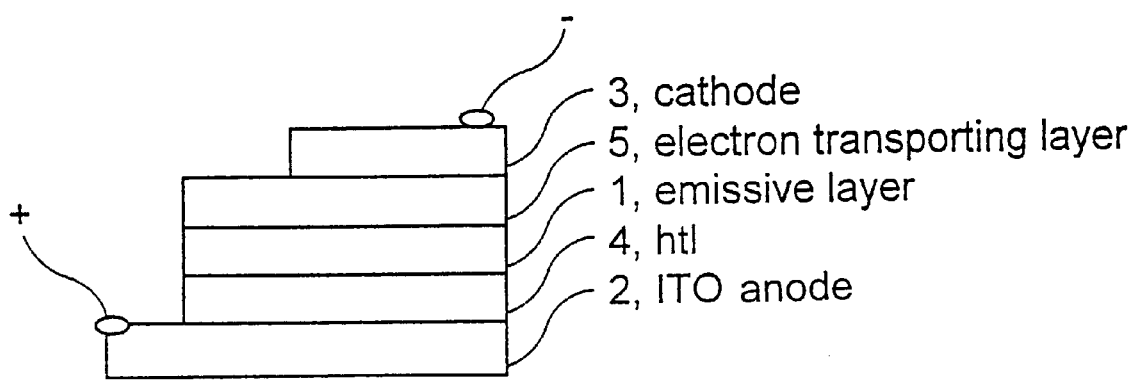

K. Tsuchiya, et al., Complex Formation and Its High Dispersion in the Simultaneous Vacuum Deposition of Copper and Phthalocyanine, Faculty of Engineering, Yamagata University, Yonezawa, Japan, 1998, pp. 149–154.

L. K. Templeton, et al., Anomalous Scattering by Praseodymium, Samarium and Gadolinium and Structures of their Ethylenediaminetetraacetaate (edta) Salts, Acta. Cryst. (1982). B38, pp. 2155–2159.

J. Kido, et al., Bright red light–emitting organic electroluminescent devices having a europium complex as an emitter, Applied Physics Letters, 65 (17), Oct. 24, 1994, pp. 2124–2126.

T. Wakimoto, et al., Organic EL cells with high luminous efficiency, Applied Surface Science 113/114 (1997) pp. 698–704.

J. Kido, et al., Electroluminescence in a Terbium Complex, Chemistry Letters, The Chemistry Society of Japan, 1990, pp. 657–660.

* cited by examiner

METHOD FOR FORMING FILMS OR LAYERS

This application is a national stage application of PCT/GB99/04030 filed Dec. 1, 1999. PCT/GB99/04030 was published in English under publication number WO 00/32719 on Jun. 8, 2000.

The present invention relates to a method of forming films or layers of organic-metallic complexes and more particularly it relates to a method of forming organic-metallic complexes and depositing them on a substrate.

When Conning a complex of an organic ligand and a metal, a salt of the metal and the organic ligand are reacted together under the appropriate conditions in solution in a suitable solvent. A very large number of reactions are well known and a very large number of organic-metallic complexes are known and are formed by this process.

A particular class of organic-metallic complexes are formed transition metals. lanthanides and actinides and these complexes have a very large range of applications in catalysis, electrical and electronic devices etc.

Some organic-metallic complexes have electroluminescent or pliotoluminescent properties and have been described in an article in Chemistry, Letters pp 657–660, 1990 Kido et al and in an article in Applied Physics Letters 65 (17) Oct. 24, 1994 Kido et al but these were unstable in atmospheric conditions and difficult to produce as films.

Photoluminescent complexes which arc rare earth chelates which fluoresce in ultra violet radiation are known and A. P. Sinha (Spectroscopy of Inorganic Chemistry Vol. 2 Academic Press 1971) describes several classes of rare earth chelates with various monodentate and bidentate ligands.

Group III A metals and lanthanides and actinides with aromatic complexing agents have been described by G. Kallistratos (Chimica Chronika, New Series. 11, 249–266 (1982)). This reference specifically discloses the Eu(III), Ib(III) and U(III) complexes of diphenyl-phosponainidotriphienyl-phosphoran.

EP 0744451A1 also discloses fluorescent chelates of transition or lanthanide or actinide metals.

When forming an electroluminescent or photoluminescent device which incorporates an organic-metallic complex as the clectroluminescent or photoluminescent active material, a film of the electroluminescent or photoluminescent compound has to be formed on a substrate. This is normally done by deposition of the compound from solution onto the substrate so as to obtain a film or layer of the right thickness etc.

The organic-metallic complex can be formed in solution and deposited from this solution or it can be separated and dissolved in another solvent and deposited from this solution etc. or it can be finned by vacuum evaporation of the solid material.

We have invented an improved method of forming a film or layer of an organic-metallic complex on a substrate which does not require a solution to be formed nor does it require multiple syntheses.

According to the invention there is provided a method for forming a film or layer of an organic-metallic complex on a substrate which method comprises vaporising a metal compound and vaporising an organic complex and condensing the vapour on to a substrate to form a film or layer of the organic-metallic complex on the substrate.

In one embodiment the invention comprises mixing a powder comprising a metal compound with a powder comprising an organic complex heating the mixture formed under a vacuum so that the mixture is vaporised and condensing the vapour on to a substrate to form a film or layer of the organic-metallic complex on the substrate.

In another embodiment of the invention the metal compound and the organic complex are vaporised sequentially.

The term vaporised includes all forms of going from the solid state to the vapour or gaseous state such sublimation etc.

The invention is particularly useful with transition metals, lanthanides and actinides which can form stable and useful complexes with organic ligands by this method.

The metal preferably is in the form of a salt such as a halide e.g. chloride or bromide which is labile so that it can be vaporised or sublimed, or an organic-metallic compound e.g. diketo complexes, acetyl acetonates, although any metal compound which will vaporised under the conditions can be used.

The invention is particularly useful for the preparation of films or layers of photoluminescent and electroluminescenf compounds including those incorporating lanthanides or actinides such as samarium, dysprosium, lutetium, thorium, yttrium gadolinium, curopium, terbium, uranium and cerium in the appropriate valence states. Any metal ion having an un filled inner shell can be used as the metal and the preferred metals are Sm(III), Eu(III), Tb(III), Dy(III), Yb(III), Lu(III), Gd(III), Eu(II), CE(III), Gd(III) U(III), $UO_2$(VI), Th(III), as well as metals with an incomplete inner shell e.g. Th(IV), Y(III), La(III), Ce(IV).

Mixtures of more than one metal compound and more than one organic complex can be used to obtain a range of mixed organic-metallic complexes. This can be achieved by mixing the compounds before vaporisation or by vaporising the compounds sequentially so as to obtain a multilayered or a mixed layer comprising organic-metallic complexes.

In another embodiment of the invention the metal compound can be deposited on the substrate an d then a mixture of the metal compound and the organic compound deposited by vaporisation of a mixture of these to obtain various types of layered structures.

The organic ligands in the organic-metallic complex formed can be any organic complex which can react with the metal compound to form an organic-metallic complex or which, when co-deposited with the organic complex forms an organic-metallic complex. It may be, particularly with sequential deposition that the organic-metal complex formed has a variable composition through the layer.

The organic ligands which can be used include

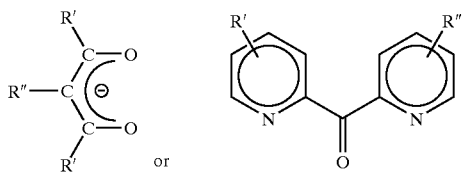

where R' is the same or different at different parts of the molecule and each R" and R' is a hydrocarbyl group e.g. alkyl, a substituted or unsubstituted aromatic or heterocyclic ring structure a fluorocarbon or R" is—$CF_3$ or hydrogen or R" is copolymerised with a monomer e.g. or R' is t-butyl and R" hydrogen.

Preferably each of R', R", and R' is an alkyl group preferably a –C(CH3) group. or

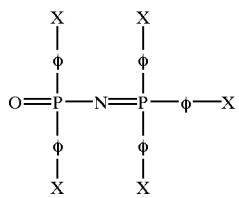

where X can be the same or different in each case and can be H, F. Me, Et, OMe, or OEt.

Preferred organic complexes are 2,2,6.6-tetramethyl-3,5-heptailedionato(TMHD); ($\alpha'_7$ $\alpha''_7\alpha'''$ tripyridyl, dibenzoyl methane(DBM), diphenylphosphonimide triphenyl phosphorane(OPNP), bathophen (4,7-diphenyl-1,1-pheanthroline), 1,10 phenanthroline (Phen) and crown ethers, cryptands, substituted calix(4)arene based ligands and other organic complexes Particularly preferred organic-metallic complexes are the Th, Y, Eu. Dy, and SM complexes of tripyridyl and TMDH and complexes such as thorium bathophen. yttrium tripyridyl and TMHD, and europium (III) $(TMHD)_3$ complexes, terbium $(TMHD)_3 OPNP$, europium (II) $(TMHD)_2$ and europium (II) $(TMHD)_2$ OPNP.

The organic complex used to form the organic-metallic complex should be in a form which is stable in powder form under the conditions of the vaporisation, for organic complexes which arc unstable in oxygen an inert atmosphere can be used.

When mixed powders of the metal compound and the organic complex are vaporised they should be of a size such that intimate mixing can take place. compounds can be bought commercially in powder form and these arc often suitable without further treatment if smaller size particles are required, the starting material can be ground. If the organic complex is formed by precipitation from a solution this can be formed as a powder which, after drying, can be mixed with the metal compound.

In one embodiment of the invention an organic-metallic complex such as a complex of a transition metal, lanthanide or actinide and any of the above specified organic ligands is mixed with an organic complex e.g. as referred to above and the resultant mixture heated in vacuum to vaporised the mixture and to deposit the organic metal complex formed onto a substrate.

In another embodiment of the invention an organic-metallic complex such as a complex of a transition metal, lanthanide or actinide and any of the above specified organic ligands is heated in vacuum to vaporised the mixture and to deposit the organic-metallic complex on the substrate and then an organic complex e.g. as referred to above and is heated in vacuum to vaporised the complex and to deposit it on top of the orano-metallic compound to form the organic-metal complex layer on the substrate.

The starting materials should be dry and if necessary they can be dried prior to heating to remove any water or other liquid compounds.

The vaporisation takes place under a vacuum which is preferably, below $10^{-5}$ torr and more preferably below $10^{-6}$ torr.

The metal compound and the organic complex or a mixture of these can be placed in a suitable coater the temperature is not critical but should be sufficient to vaporised or sublime the mixture. Temperatures above 100° C. and up to 250° C. and higher can be used.

The vapour is then condensed or deposited onto a substrate which is held at a lower temperature as in conventional vapour deposition processes e.g. chemical vapour deposition, vacuum coating, electron beam coating etc.

The substrate which can he used will depend for the purposes for which the device is to be used, as the substrate need not be subjected to heating conventional substrates can be used.

The method is particularly useful in forming electroluminescent devices in which a layer of an electroluminescent compound is deposited on to a conductive substrate optionally with other layers such as layers of hole transporting compounds and electron transporting compounds to arrive a multilayered structure in which an anode and cathode arc attached to form an electroluminescent device.

In a typical electroluminescent device there is a transparent substrate which is a glass or plastic material which acts as the anode, preferred substrates are conductive glasses such as indium tin oxide coated glass, but any glass which is conductive or has a conductive layer can be used. The electroluminescent material can be deposited on the substrate by the method of the invention or preferably there can be a hole transporting layer deposited on the transparent substrate and the electroluminescent material is deposited on the hole transporting layer. The hole transporting layer serves to transport holes and to block the electrons, thus preventing electrons from moving into the electrode without recombining with holes. The recombination of carriers therefore mainly takes place in the emitter layer.

Hole transporting layers are used in polymer electroluminescent devices and any of the known hole transporting materials in film form can be used.

The hole transporting layer can be made of a film of an aromatic amine complex such as poly(vinylcarbazole),N,N'-diphenyl-N,N'-bis (3-methylphenyl)-1,1'-biphenyl-4,4'-diamine (TPD) or polyaniline.

There is preferably an electron transporting layer between the cathode and the electroluminescent layer. This electron transporting layer can be a metal complex such as a metal quinolate e.g. an aluminium quinolate which will transport electrons when an electric current is passed through it or an organic compound such as PBD or a polymer e.g.containing cyano groups. The cathode can be any metal.

In a preferred structure there is a substrate formed of a transparent conductive material which is the anode on which is successively deposited a hole transportation layer, the electroluminescent layer and an electron transporting layer which is connected to the cathode.

Optionally dyes such as fluorescent laser dyes, luminescent laser dyes can be included to modify the colour spectrum of the emitted light and also enhance the photoluminescent and electroluminescent efficiencies.

The thickness of the layer deposited on the substrate by the method of the invention can be varied according to the conditions of the vaporisation and deposition and in general layers of from one molecule thick up to any desired thickness can be formed.

It has been surprisingly found that for electroluminescent and photoluminescent organic-metallic complexes formed by the method of the invention have superior properties to those complexes where the formed organic-metallic complex is deposited on a substrate from a solution e.g. by evaporation or spin deposition. The reason for this is not known and was unexpected.

Types of electroluminescent devices arc shown in FIGS. 1a, 1b, 1c and 1d of the drawings in which (1) is layer deposited in accordance with the invention. (2) is ITO, (3) is an electron transporting layer (4) is a hole transporting layer and (5) is an elctron transporting layer. The invention enables a emissive layer to be deposited on ITO or on to a layer previously applied to the ITO.

EXAMPLES

Thin films were made according to the invention and compared with films made by chemical synthesis. The Photoluminescence (PL) Efficiency an colour were measured and the results shown in Table 1. The colour was measured using colour chart CIE 1931.

Example 1

Thin Film $Tb(TMHD)_3$ OPNP (i) 50 mg of $Tb(TMHD)_3$ ($7 \times 10^{-5}$ moles) and 33.68 mg of OPNP($7.05 \times 10^{-5}$ moles) were ground together in a mortar and pestle and a 3 mg portion was placed on a molybdenum boat in an Edwards(E306) vacuum coater. Spectrosil slides (UVgradc) were secured on a sample holder. The vacuum coater was evacuated to $10^{31\ 7}$ torr and the sample was heated using an electrical heater at 10 to 90 A and 10V for up to twenty seconds to give a film of $Tb(TMHD)_3$ OPNP.

Figure 3:
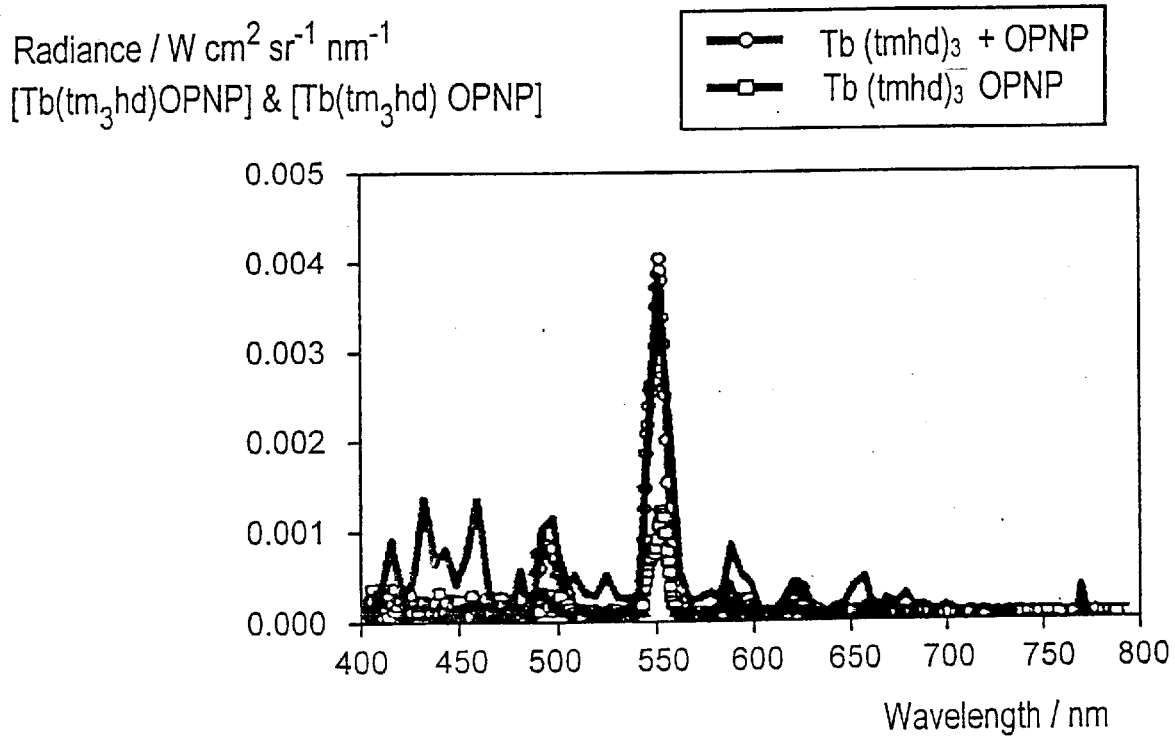

Comparative experiments were carried out on (ii) a film of $Tb(TMHD)_{3\ OPNP}$ (3 mg) pre-synthesised from a soliution and (iii) and a film of $Tb(TMHD)_3$ (3 mg) purchased from Strenm chemicals. Cambridge. The spectra are showing in FIG. 3.

Example 2

Thin Film $Eu(DBM)_3$ OPNP (i) 50 mg of $Eu(DBM)_3$ ($6 \times 10^{-5}$ moles) was mixed with 57.43 mg of OPNP ($1.2 \times 10^{-1}$ moles) and ground in a mortar and pestle. The mixture was evaporated as in Example 1 to form a film of $Eu(DBM)_3 (OPNP)_n$.

Figure 4:
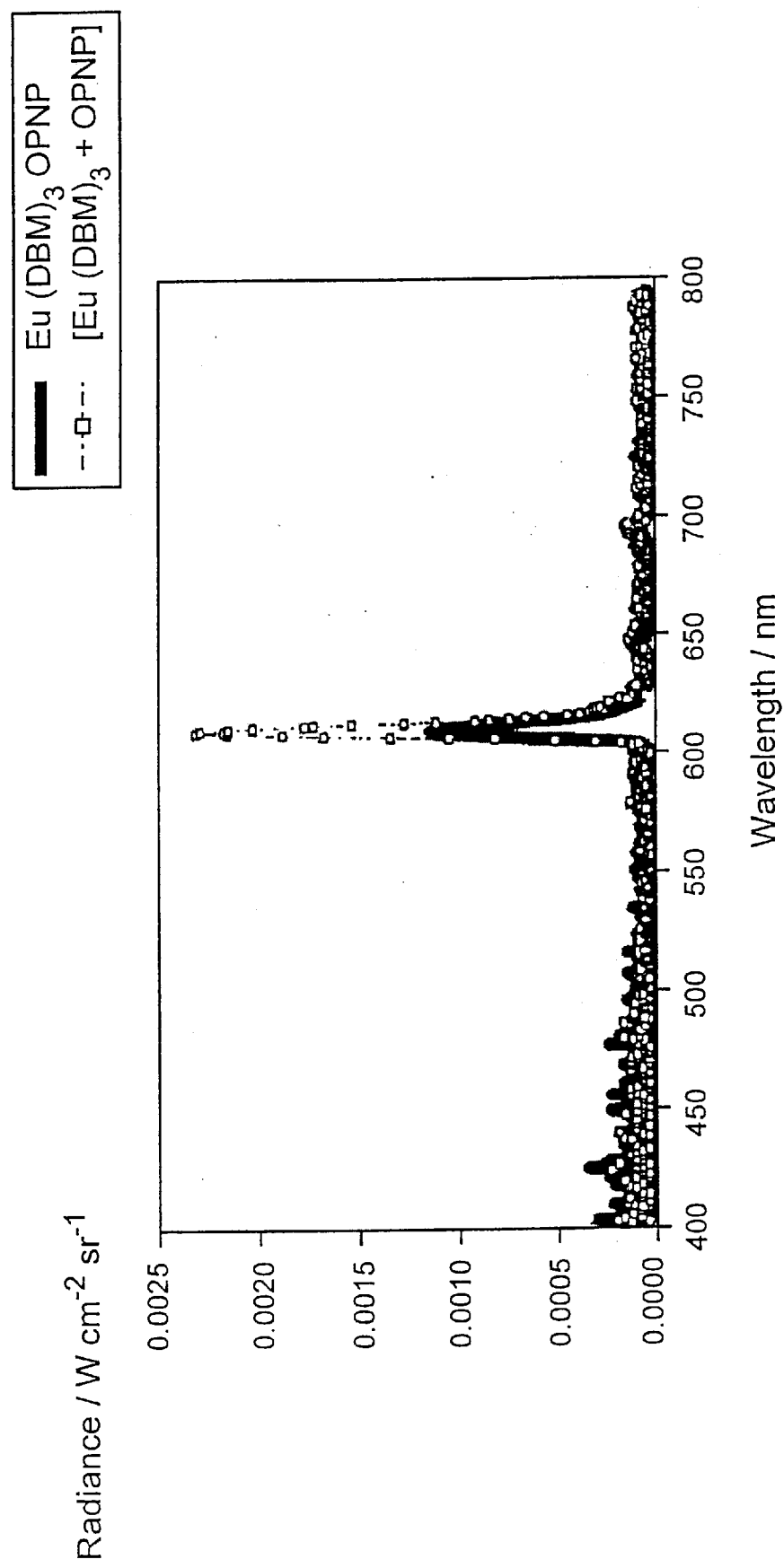

(ii) A Comparative experiment was carried out on a chemically synthesised film of $Eu(DBM)_3(OPNP)_n$. The spectra are shown in FIG. 4.

TABLE 1

| Example | System | Relative PL Efficiency | CIE(x) | CIE(y) |
|---|---|---|---|---|
| 1(i) | $Tb(TMHD)_3$ OPNP(50 nm) | 2 | 0.35 | 0.58 |
| 1(ii) | $Tb(TMHD)_3$ OPNP (40 nm) | 1 | 0.35 | 0.69 |
| 1(iii) | $Tb(TMHD)_3$ (50 nm) | $1 \times 10^{-3}$ | 0.29 | 0.62 |
| 2(i) | $Eu(DBM)_3$ $OPNP_n$(50 nm) | 1.4 | 0.62 | 0.32 |
| 2(ii) | $Eu(DBM)_3$ $OPNP_n$(50 nm) | 1 | 0.58 | 0.30 |

Example 3

Figure 2:
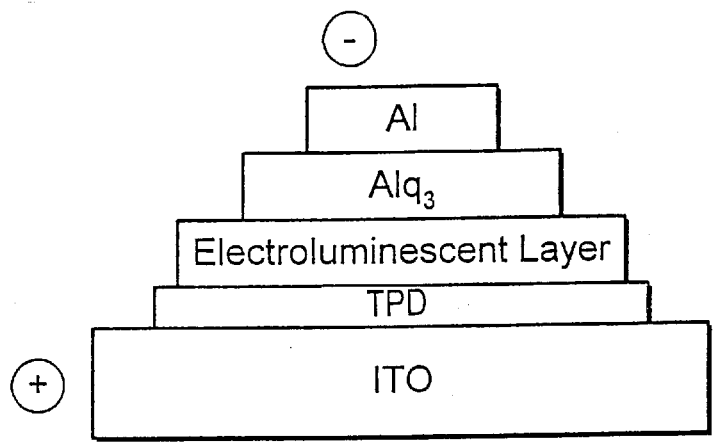

Fabrication of an Electroluminescent Devices Based on $Tb(TMHD)_3$ OPNP (i) A 3 mg mixture of $Tb(TMHD)_3$ OPNP prepared as in Example 1 was evaporated onto a patterned ITO electrode to give a film of 50 nm thickness. The patterned ITO had been previously coated with 20 nm of a hole transporting layer formed of TPD. Aluminium quinolate ($Alq_3$) was then evaporated on top the layer give a film of 20 nm thickness to act as an electron-transporting layer. An aluminiurm top contact (900 nm) was made to form the structure of FIG. 2 of the drawings.

(ii) A comparative experiment was carried out using the same structure and configuration but using a chemically synthesised $Tb(TMHD)_3$ OPNP.

The luminous efficiency was measured and the results shown in Table 3.

TABLE 3

| System | Normalised Absolute Efficiency ($\eta/lm\ w^{-1}$) |
|---|---|
| (i) $Tb(TMHD)_3$ OPNP | 6.0 |
| (ii) $Tb(TMHD)_3$ OPNP | 1.0 |

As can be seen the device based on a film formed by the method of the invention has a much higher luminous efficiency.

Example 4

Fabrication of an Electroluminescent Device Based on $Eu(DBM)_3$ Phen

The structure of Example 4 was fabricated using an equimolar mixture of $Eu(DBM)_3$ and 1,10 Phenanthroline in place of the $Tb(TMHD)_3$ OPNP so as to form a film of $Eu(DBM)_3$ Phen. The experimental conditions and the structural configuration were as in example 4

The luminous efficiency was measured and the results shown in Table 4.

TABLE 4

| System | Normalised Absolute Efficiency ($\eta/lm\ w_{-1}$) |
|---|---|
| (i) $Eu(DBM)_3Phen$ | 1.1 |
| (ii) $Eu(DBM)^3Phen$ | 1.0 |

As can be seen the device based on a film formed by the method of the invention has a 10% higher luminous efficiency.

What is claimed is:

1. A method for forming a layer of an organic-metallic complex on a substrate which comprises vaporising at least one labile metal compound selected from the group consisting of salts of a transition metal, salts of lanthanides, salts of actinides, organic-metallic compounds of transition metals, organic-metallic compounds of lanthanides and organic-metallic compounds of actinides together with at least one organic complex, and condensing the vapour on to a substrate to form a layer or the organic-metallic complex on the substrate the layer having improved luminous efficiency.

2. A method as claimed in claim 1 in which at least one labile metal compound includes metal selected from the group consisting of Sm(III), Eu(III), Tb(III), Dy(III), Yb(III), Lu(III), Gd(III), Eu(II), Ce(III), Gd(III), U(III), $UO_2$(VI), Th(IV), Y(III), La(III) and Ce(IV).

3. A method as claimed in claim 2 in which mixtures of more than one metal compound and at least one organic complex are vaporised to obtain a mixed organic-metallic complex.

4. A method as claimed in claim 3 in which the said labile metal compound is deposited on the substrate, and then a mixture of the said metal compound and the said organic compound is deposited by vaporization thereby forming a layered structure.

5. A method as claimed in claim 3 in which the organic complex includes a moiety having a formula selected from the group consisting of

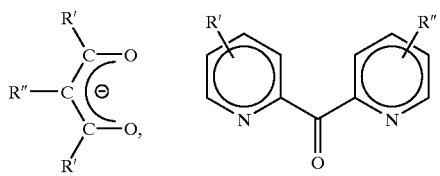
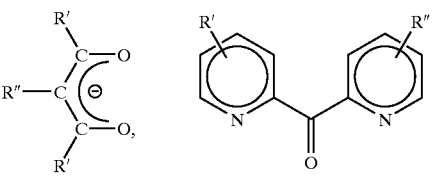

where R' is the same or different at different parts of the molecule and each R" and R' is a hydrocarbyl group, a substituted or unsubstituted aromatic or heterocyclic ring structure or a fluorocarbon or R' is —CF$_3$ or hydrogen or R" is copolymerised with a monomer or R' is t-butyl and R" hydrogen, and where R' is the same or different at different parts of the molecule and each R" and R' is a hydrocarbyl group, a substituted or unsubstituted aromatic or heterocyclic ring structure or a fluorocarbon or R" is —CF$_3$ or hydrogen or R" is copolymerised with a monomer or R' is t-butyl and R" hydrogen, and

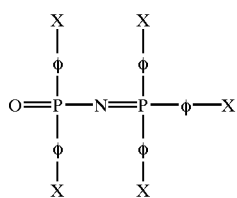
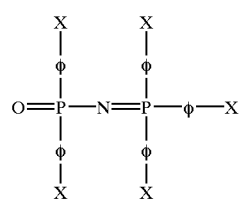

where X can be the same or different in each case and can be H, F, Me, Et, OMe, or OEt or a phenanthroline.

6. A method as claimed in claim 3 in which the organic complex is selected from the group consisting of 2,2,6,6-tetramethyl-3,5-heptanedionato(TMHD); α',α",α'", tripyridyl, dibenzoyl methane(DBM), diphenylphosphonimide triphenyl phosphorane(OPNP), bathophen (4,7-diphenyl-1,1-phenanthroline), 1,10 phenanthroline (Phen), crown ethers, cryptands and substituted calix(4)arene based ligands.

7. A method as claimed in claim 3 in which the organic-metallic complex is selected from the group consisting of Th, Y, Eu, Dy, and Sm complexes of tripyridyl and TMDH; thorium bathophen; yttrium tripyridyl and TMHD; europium (III) (TMHD)$_3$; terbium (TMHD)$_3$ OPNP; europium (II) (TMHD)$_2$ and europium (II) (TMHD)$_2$ OPNP.

8. A method as claimed in claim 1 in which mixtures of more than one metal compound and at least one organic complex are vaporised to obtain a mixed organic-metallic complex.

9. A method as claimed in claim 1 in which the organic complex includes a moiety having a formula selected from the group consisting of where X can be the same or different in each case and can be H, F, Me, Et, OMe, or OEt or a phenanthroline.

10. A method as claimed in claim 9 in which each of R', R", and R' is an alkyl group.

11. A method as claimed in claim 9 in which the organic complex is selected from the group consisting of 2,2,6,6-tetramethyl-3,5-heptanedionato(TMHD); α', α", α'", tripyridyl, dibenzoyl methane(DBM), diphenylphosphonimide triphenyl phosphorane(OPNP), bathophen (4,7-diphenyl-1,1-phenanthroline), 1,10 phenanthroline (Phen), crown ethers, cryptands and substituted calix(4)arene based ligands.

12. A method as claimed in claim, 9 in which the organo-metallic complex is selected from the group consisting of Th, Y, Eu, Dy, and Sm complexes of tripyridyl and TMDH; thorium bathophen; yttrium tripyridyl and TMHD; europium (III) (TMHD)$_3$; terbium (TMHD)$_3$ OPNP; europium (II) (TMHD)$_2$ and europium (II) (TMHD)$_2$ OPNP.

13. A method for forming a layer of an organic-metallic complex on a substrate which comprises sequentially vaporising (i) a labile metal compound selected from the group consisting of salts of transition metals, salts of lanthanides, salts of actinides, organic-metallic compounds of transition metals, organic-metallic compounds of lanthanides and organic-metallic compounds of actinides and (ii) an organic complex and condensing the vapors on to a substrate to form a layer of the organic-metallic complex on the substrate, they layer having improved luminous efficiency.

* * * * *